(12) United States Patent
Sartschev et al.

(10) Patent No.: US 7,574,632 B2
(45) Date of Patent: Aug. 11, 2009

(54) STROBE TECHNIQUE FOR TIME STAMPING A DIGITAL SIGNAL

(75) Inventors: Ronald A. Sartschev, Andover, MA (US); Ernest P. Walker, Weston, MA (US)

(73) Assignee: Teradyne, Inc., North Reading, MA (US)

( * ) Notice: Subject to any disclaimer, the term of this patent is extended or adjusted under 35 U.S.C. 154(b) by 609 days.

(21) Appl. No.: 11/234,814

(22) Filed: Sep. 23, 2005

(65) Prior Publication Data

US 2007/0071080 A1    Mar. 29, 2007

(51) Int. Cl.
*G11B 20/20* (2006.01)

(52) U.S. Cl. .................................................... 714/700

(58) Field of Classification Search ................ 714/710, 714/731, 700; 375/224
See application file for complete search history.

(56) References Cited

U.S. PATENT DOCUMENTS

| | | | |
|---|---|---|---|
| 3,363,183 A | 1/1968 | Bowling et al. | 328/63 |
| 3,471,790 A | 10/1969 | Kaps | 328/63 |
| 3,612,906 A | 10/1971 | Kennedy | 307/269 |
| 3,947,697 A | 3/1976 | Archer et al. | 307/208 |
| 3,997,740 A | 12/1976 | Eubank et al. | |
| 4,119,910 A | 10/1978 | Hayashi | 324/83 R |
| 4,488,108 A | 12/1984 | Treise et al. | 324/83 D |
| 4,686,458 A | 8/1987 | Beyerbach et al. | 324/83 D |
| 4,989,202 A | 1/1991 | Soto et al. | |
| 5,003,194 A | 3/1991 | Engelhard | 307/265 |
| 5,084,669 A | 1/1992 | Dent | 324/83 D |
| 5,258,968 A | 11/1993 | Matsuda et al. | 369/44.35 |
| 5,293,079 A | 3/1994 | Knoch | 307/234 |
| 5,321,700 A | 6/1994 | Brown et al. | 371/27 |
| 5,381,100 A | 1/1995 | Hayashi | 324/601 |
| 5,483,534 A | 1/1996 | Ohki et al. | |
| 5,499,190 A | 3/1996 | Takahashi et al. | |
| 5,568,071 A | 10/1996 | Hoshino et al. | 377/43 |

(Continued)

FOREIGN PATENT DOCUMENTS

WO    WO/20072038233    4/2007

OTHER PUBLICATIONS

International Search Report and Written Opinion for Application No. PCT/US06/37100 mailed on Sep. 25, 2007, 10 pages.

(Continued)

*Primary Examiner*—James C Kerveros
(74) *Attorney, Agent, or Firm*—Foley & Lardner LLP; Joseph M. Maraia; Ralph Trementozzi

(57) ABSTRACT

A system and apparatus generates a time-stamp to identify and record the time of an event such as an edge received in a data signal or clock signal. A set of strobe pulses can be generated by routing an external clock signal to delay elements with incrementally increasing delay values. A data signal or device under test clock signal can be applied to the input to each of a set of latches which are clocked by the strobe pulses. The set of latches can thereby capture a series of samples of the data signal or clock signal. The series of samples can be encoded as an edge time within a clock cycle. A clock cycle counter can be added to the edge time to generate the time stamp.

7 Claims, 6 Drawing Sheets

U.S. PATENT DOCUMENTS

| | | | | |
|---|---|---|---|---|
| 5,818,849 | A * | 10/1998 | Komatsu | 714/724 |
| 6,173,207 | B1 | 1/2001 | Eidson | |
| 6,198,700 | B1 | 3/2001 | Sassoon | |
| 6,204,710 | B1 | 3/2001 | Goetting et al. | |
| 6,233,528 | B1 | 5/2001 | Lai et al. | 702/69 |
| 6,285,722 | B1 | 9/2001 | Banwell et al. | |
| 6,291,981 | B1 | 9/2001 | Sartschev | 324/76.82 |
| 6,377,065 | B1 * | 4/2002 | Le et al. | 324/765 |
| 6,437,589 | B1 | 8/2002 | Sugano | 324/763 |
| 6,556,640 | B1 | 4/2003 | Baba | |
| 6,606,360 | B1 | 8/2003 | Dunning et al. | |
| 6,643,810 | B2 | 11/2003 | Whetsel | |
| 6,715,111 | B2 * | 3/2004 | Self et al. | 714/56 |
| 6,735,543 | B2 | 5/2004 | Douskey et al. | 702/120 |
| 6,771,061 | B2 | 8/2004 | Sartschev et al. | |
| 6,868,047 | B2 | 3/2005 | Sartschev et al. | |
| 7,054,374 | B1 | 5/2006 | Jensen et al. | |
| 7,266,738 | B2 * | 9/2007 | Sato | 714/718 |
| 2003/0046622 | A1 * | 3/2003 | Whetsel | 714/724 |
| 2004/0260492 | A1 | 12/2004 | Halle et al. | |
| 2005/0157780 | A1 | 7/2005 | Werner et al. | |
| 2005/0157781 | A1 | 7/2005 | Ho et al. | |
| 2007/0091991 | A1 | 4/2007 | Sartschev et al. | |
| 2007/0126487 | A1 | 6/2007 | Sartschev et al. | |

OTHER PUBLICATIONS

International Search Report and Written Opinion of Application No. PCT/US06/37099 mailed on Sep. 18, 2007, 6 pages.

International Search Report and Written Opinion for Application No. PCT/US2006/036912 mailed on Oct. 30. 2008, 11 pages.

Eby G. Friedman, "Clock Distribution Networks in Synchronous Digital Integrated Circuits", Proceedings of the IEEE, vol. 89, No. 5, May 2001, pp. 665-692.

Grochowski et al., "Integrated Circuit Testing for Quality Assurance in Manufacturing: History, Current Status, and Future Trends", IEEE Transactions on Circuits and Systems-II: Analog and Digital Signal Processing, vol. 44, No. 8, Aug. 1997, pp. 610-633.

Chang et al., "A Wide-Range Delay-Locked Loop With a Fixe Latency of One Clock Cycle", IEEE Journal of Solid-State Circuits, vol. 37, No. 8, Aug. 2002, pp. 1021-1027.

Dr. Paul D. Franzon, ECE 733 Class Notes, www.ece.ncsu.edu/erl/faculty/paulf.html, No. 12-47, dated 2003.

Office Action for U.S. Appl. No. 11/234,542 dated Jan. 21, 2009.

Office Action for U.S. Appl. No. 11/234,542 dated Jul. 9, 2008.

Notice of Allowance for U.S. Appl. No. 11/234,599 dated Jan. 12, 2009.

Office Action for U.S. Appl. No. 11/234,599 dated Aug. 29, 2008.

* cited by examiner

STROBE TECHNIQUE FOR TIME STAMPING A DIGITAL SIGNAL

FIELD OF THE INVENTION

The present invention relates generally to automatic testing of semi-conductor chips and more specifically to digital signal timing measurements.

BACKGROUND OF THE INVENTION

Automatic test equipment (ATE) is universally used to test semi-conductor chips and integrated circuits during their manufacture. Functional testing is typically performed by configuring the ATE to apply electrical signals to numerous connection points on the device under test (DUT) while measuring the output response of the DUT at certain connection points.

ATE typically determines the relative timing between applied input signals and measured output signals when evaluating the performance of a DUT. Very accurate timing of the test system clock is often required to ensure that appropriate data is collected, particularly when evaluating a DUT's response to high speed signals.

It is often desirable to test the performance of a DUT relative to its own system clock. Accordingly, ATE can typically be configured to measure output at times relative to the DUT's internal clock. However, measurements relative to the DUT's system clock can be inaccurate at high data rates and clock speeds because signal slewing and jitter significantly affect measurement results.

Many Integrated Circuits (ICs) now include buses with a synchronous clock that accompanies the data. It is impractical to access a DUT's synchronous internal clock without tying up valuable test system hardware channels. It has also heretofore been problematic to use a test system clock to test data on buses having a synchronous clock because data on the bus may have very high jitter relative to the test system clock.

A method and apparatus which uses a test system clock to emulate the DUT clock for comparison with DUT data signals without suffering the excessive slew and jitter usually associated with use of the system clock is described in Applicant's co-pending U.S. patent application entitled, STROBE TECHNIQUE FOR TEST OF DIGITAL SIGNAL TIMING, filed Sep. 23, 2005, U.S. application Ser. No. 11/234,542, which is incorporated herein by reference.

It is often desirable to acquire a precise edge time of a data signal or clock signal and associate a time-stamp therewith. In the field of ATE, for example, it is often desirable to have a time-stamp to record the time a particular data signal edge, or clock signal edge is received from a DUT.

SUMMARY OF THE INVENTION

Embodiments of the present invention generate a time-stamp to identify and record the time of an event such as an edge received in a data signal or clock signal. In an exemplary embodiment, a set of strobe pulses is generated by routing an external clock signal such as a MOSC/8 clock to a series of delays with incrementally increasing delay values. A digital signal, such as a data signal or synchronous clock signal, is applied to the input to each of a set of parallel latches which are clocked by the strobe pulses. The set of parallel latches thereby captures a single shot series of samples of the data signal or clock signal.

An encoder converts the single shot series of samples to a word representing edge time and polarity of the sampled signal. If the signal is a data signal, the word can be stored in random access memory. If the signal is a clock signal, the word can be routed to a clock bus and used to address the random access memory. The difference between clock edge time and data edge time can be determined and compared against expected values.

A counter which also receives the external clock signal can be used to identify which clock cycle is currently input to the sampler. The encoded edge time of the data signal or clock signal that is output from the encoder can be input to time-stamp circuitry along with output from the counter. The time-stamp circuitry combines the counter output with the encoded edge time to output a precise time of the current clock edge. Time-stamp logic can be added to latch the precise time information, or to route it to memory.

In an illustrative embodiment, the present invention provides a method for generating a time-stamp for a digital signal by providing a strobe triggered by time-stamp clock, applying the strobe to digital signal of a device, storing the state of the digital signal at the time of each strobe pulse of the strobe and combining a time-stamp clock count with the time of at least one of the strobe pulses. In the illustrative embodiment, the strobe includes a plurality of uniformly spaced strobe pulses having a frequency greater than or equal to a frequency of the digital signal. The digital signal can be a data signal or a clock signal, for example.

A particular embodiment of the invention reads the stored state of the digital signal at the time corresponding to a strobe pulse of the strobe at which the state change of the clock signal occurs. The delay between a state change of the data signal and a state change of the clock signal can be determined by counting strobe pulses therebetween.

The strobe can be generated by applying the time-stamp clock to delay circuitry including a plurality of delay elements and providing a connection between each of the delay elements to receive a plurality of sequentially delayed copies of pulses in the time-stamp clock signal. In an illustrative embodiment, the plurality of delay elements are arranged in series. The delay circuitry can be controlled by a delay locked loop and wherein the delay elements include controllable summing elements are tunable to correct delay line errors.

In the illustrative embodiment, the strobe can be applied to the digital signals of the device under test by applying each pulse of the strobe as a latch-clock signal to a corresponding latch of a plurality of latches, applying the digital signal of the device under test to the input of each of the latches and receiving the state of the digital signal of the device under test as output of each of the latches.

Storing of the data signals can be performed by receiving strobed samples of the digital signal of the device under test in parallel as a series of samples and encoding the strobed samples as a digital word to identify the time of a state change in the digital signal. In a particular embodiment, the digital word can be added to the clock count to generate the time-stamp. The digital words thus produced can be de-multi-plexed to reduce the data transfer rate of the word. The time-stamp can then be output in association with a transition event in the data or clock signal of the device under test.

In another illustrative embodiment, the present invention provides an apparatus for generating a time stamp for a digital signal. The illustrative apparatus includes a time-stamp clock which provides input to sampling circuitry. The sampling circuitry includes a plurality of increasing strobe delays of the time-stamp clock each triggering a latch which samples a digital signal of a device under test. An encoder is disposed in communication with the sampling circuitry. The encoder transforms the sampled digital signals to edge time data in a binary word. A counter is disposed in communication with the time-stamp clock and outputs a count of the time-stamp clock to time-stamp circuitry. The time-stamp circuitry combines the count with the binary word to generate a time-stamp of an edge/event in the digital signal. In a particular embodiment, time-stamp logic circuitry is disposed in communication with the time-stamp circuitry. The time-stamp logic circuitry is adapted for outputting the time-stamp of the edge/event.

BRIEF DESCRIPTION OF THE DRAWINGS

The foregoing and other features and advantages of the present invention will be more fully understood from the following detailed description of illustrative embodiments taken in conjunction with the accompanying drawings in which.

DETAILED DESCRIPTION

Figure 1:
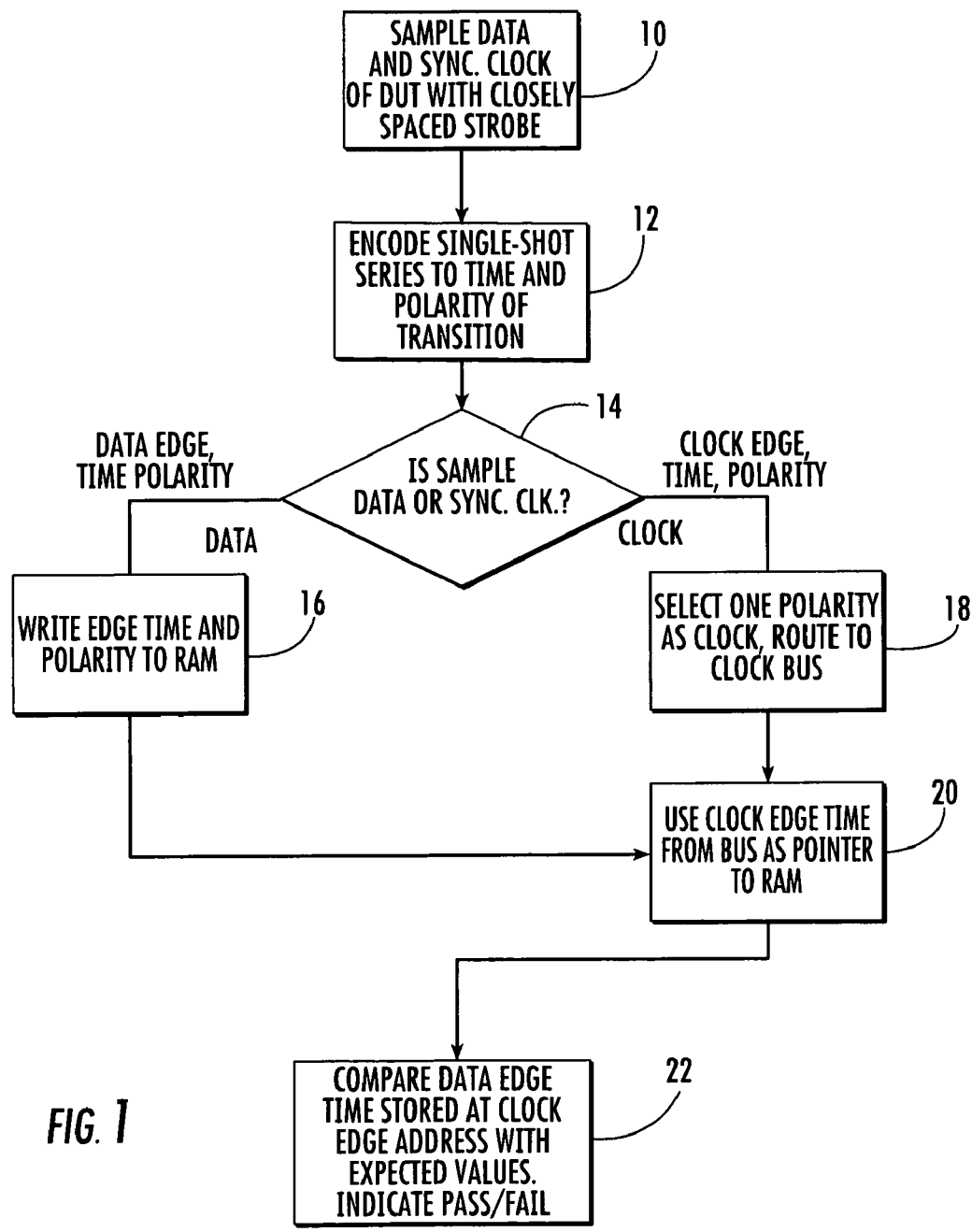
FIG. 1 is a functional block diagram of a method for testing data signals or clock signals of a device under test using particular elements of illustrative embodiments of the present invention.

An illustrative method for testing and evaluating synchronously clocked data without directly comparing the synchronous clock signals to the data signals under test is described generally with reference to FIG. 1.

In a sampling step 10, data signals and clock signals of a device under test (DUT) are sampled to acquire binary values of their state at a high rate using a strobe. The sampled data is thus acquired as a single-shot series of samples of the signal under test. It should be understood that, although the term "single-shot" is used herein, multiple iterations of the sampling step 10 can be performed, for example on multiple channels or over time in multiple iterations of the inventive time stamping method, such that a plurality of "single-shot" series can be acquired in various embodiments of the present invention.

Within the single shot series, an edge time and edge polarity of the data signal and/or clock signal of the device under test is detected. In an encoding step 12, the detected edge time and polarity is encoded in a binary word. In an illustrative example, the encoded edge time is represented as the five least significant bits of a 6-bit word and the polarity is represented as the most significant bit.

In an example of high speed test equipment using the present method, the encoded 6-bit words are generated at about 2 gigabytes per second. To provide a data rate more suitable for the storage and comparison steps downstream, the encoded words may be de-multiplexed to provide 48-bit words at only 250 megabytes per second. The 48-bit words represent eight 5-bit edge times and the corresponding eight 1-bit edge polarities.

In a selector step 14, it is determined whether the encoded data represents the edge time and polarity of a sampled data signal or the edge time and polarity of sampled clock signal. If the encoded data represents the edge time and polarity of a sampled data signal, a storage step 16 is performed in which the encoded data is stored in random access memory. In the illustrative method a 96 by 40 random access memory is used to store the encoded data.

If the encoded data represents the edge time and polarity of a sampled synchronous clock signal, then only encoded data having one polarity is selected and used as a clock edge time. In a clock selection step 18, the encoded clock edge time is routed to a clock bus. Thus, the clock edge data can be routed to a plurality of channels and used in one or more chips.

In a memory accessing step 20, the clock data is used as a pointer to the random access memory address of corresponding encoded data signal edge time. In a comparison step 22, the data edge time found in memory at the clock address is compared to an expected value to determine whether the represented data signal edge time is within pre-specified limits of the represented clock edge time. A pass/fail indication can thereby be automatically generated.

Figure 2:
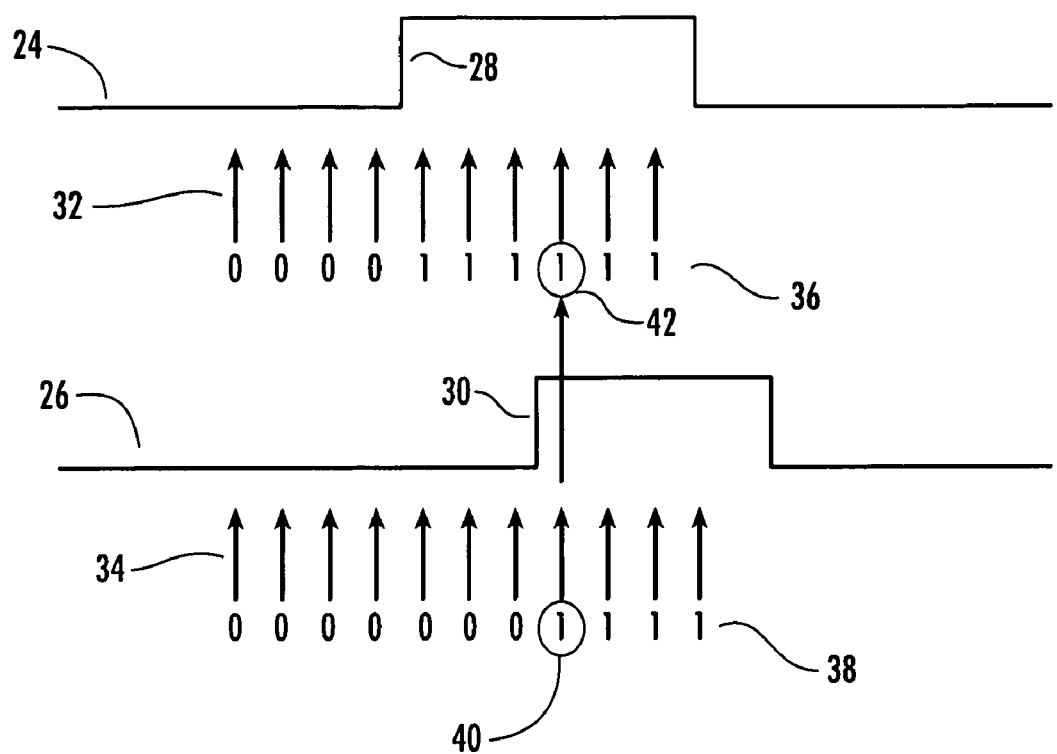
FIG. 2 is a schematic timing diagram showing the application of a strobe to data signals and clock signals according to an illustrative embodiments of the present invention.

The sampling step 10 is performed to acquire closely spaced readings of the state of a data signal and/or clock signal of the DUT. FIG. 2 is a schematic timing diagram showing an example of the relative timing of a data signal 24 edge and a clock signal 26 of a device under test. The data signal 24 in a device under test is shown as a voltage/logic level that changes state at edge 28. The clock signal 26 changes state at edge 30. The strobes 32, 34 provide pulses which each trigger a sampling of the state of the data signal under test.

The sampling thereby results in a series of bits 36, 38 indicating the state of the data or clock signal under test at closely spaced time intervals. A change of state 40 in the series of bits 38 representing the clock signal can be used as a timing reference for comparison against the state 42 of the data signal in the series of bits 36 representing the data signal. In the illustrative method, the series of bits 36 and 38 are further encoded before a comparison is made therebetween as described herein with reference to FIG. 1 and FIG. 4.

It should be understood by persons skilled in the art that the term "closely spaced" as used throughout the present specification to describe a series of strobe pulses or signals should be broadly interpreted and that such spacing may vary according to the needs of a particular test application. It should be understood that such pulses or signals that are "closely spaced" relative to the timing of a device under test would likely have a higher frequency than the signal under test or clock signal, or may have the same frequency.

Figure 3:
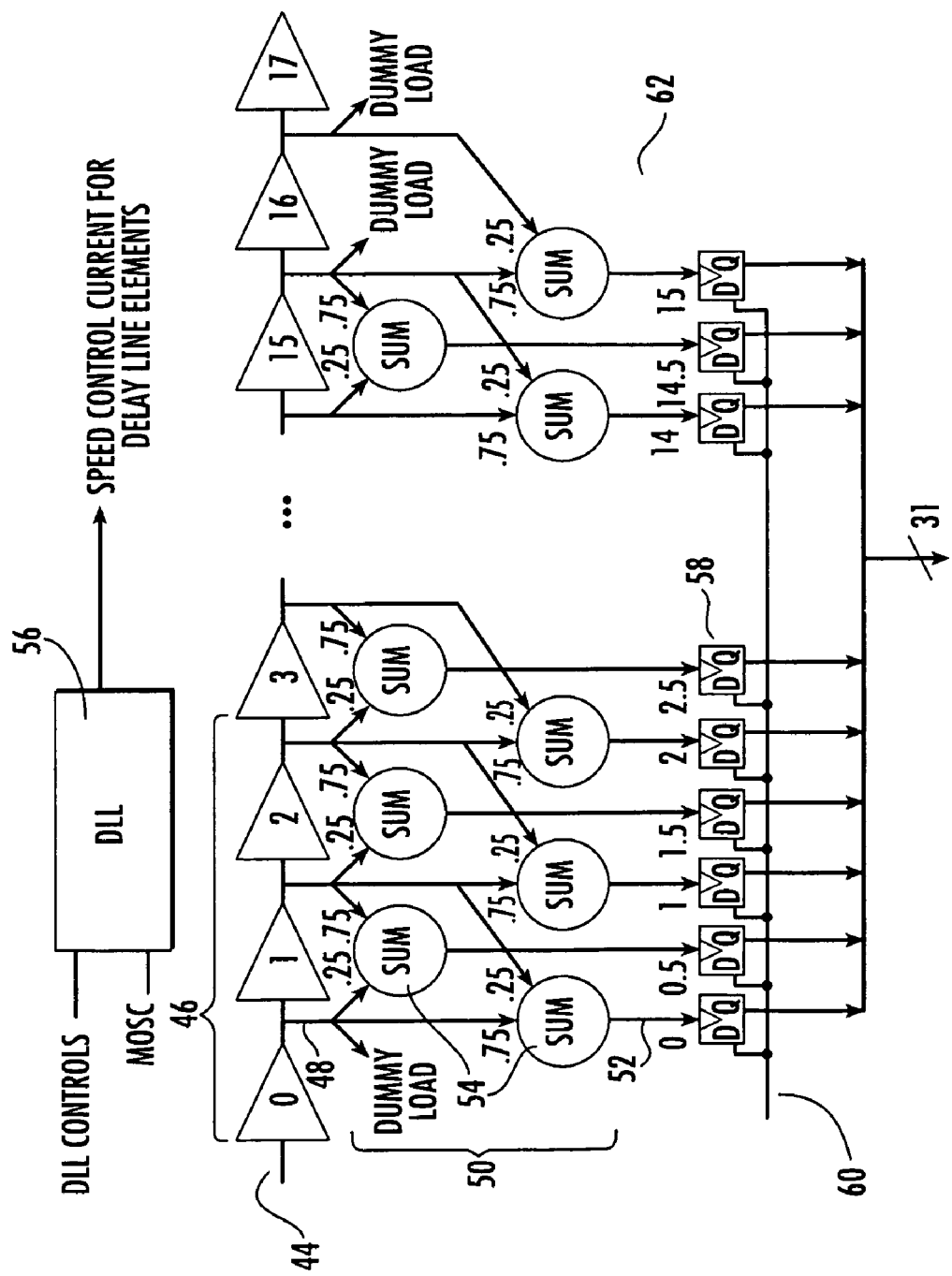
FIG. 3 is a schematic diagram of multi-strobe sampler used in the several illustrative embodiments of the present invention.

A sampling apparatus for acquiring strobed samples of a data or clock signal under test is shown in FIG. 3. An initiator signal such as a single strobe pulse is generated by a conventional edge generator, and applied to a delay line input 44. A series of delay elements output incrementally delayed copies 48 of the initiator signal. In the illustrative apparatus, the incrementally delayed copies 48 of the initiator signal are directed through summing circuitry 50 as known in the art to interpolate between the delay elements and thereby provide additional more closely spaced copies 52 of the initiator signal.

In the illustrative apparatus, the summing circuitry 50 includes summing elements 52 which each comprise a Gilbert cell based on a fine vernier with 8 settings (i.e., 3-bit control). The settings can be tuned to correct delay line errors. Speed control currents for the delay line elements 46 are provided by a delay locked loop 56. Each of the delayed copies of the input strobe pulse are provided to the clock input of a corresponding D-latch 58. The data signal or synchronous clock signal under test 60 is routed to the input to each of the D-latches. As a result, the data stored in the D-latches represents a, binary snap shot of the states of the data signal, or clock signal under test. In the illustrative apparatus, a set of 31 D-latches is used to capture a 31-bit wide strobed representation of the signal under test.

An apparatus for using a strobed representation of the synchronous clock to test data signals in a DUT according to an illustrative embodiment of the present invention is described with reference to FIG. 4. A signal under test 59 and a strobe 61 are applied to a sampling circuit 62. In the illustrative apparatus, the sampling circuit 62 is the sampling apparatus described in detail with respect to FIG. 3. An encoder circuit 64 in communication with the sampling circuit 62 accepts the strobed representation of the signal under test from the sampling circuit 62 and converts it to a data word representing an edge time and an edge polarity, (i.e., high to low or low to high) of the signal under test 59. In the illustrative apparatus, the encoder converts a 31-bit binary snap shot of the edge transition to a 6-bit word. The most significant bit is used to represent the edge polarity and the remaining 5-bits are used to represent the edge time of the signal under test. Although the encoding described herein uses 6-bit words, and 1-bit polarity representation for purposes of illustration, persons having ordinary skill in the art should appreciate that numerous other word lengths can be used and data can be encoded therein under other schemes.

In the illustrative apparatus, the 6-bit words are output from the encoder at about 2 gigabytes per second. A de-multiplexer 66 in communication with the encoder 64 is used to convert the data into 48-bit words at a data rate of 250 megabytes per second. The 48-bit words include eight 5-bit data words representing edge times and their corresponding eight single polarity bits. Persons having ordinary skill in the art should appreciate that de-multiplexing may not be necessary in all cases and that various other bit rates and/or de-multiplexing details can be chosen within the scope of the present disclosure.

Router circuitry 70 is used to route signals that represent the synchronous clock of the DUT onto a tester clock bus 72. The routing circuitry 70 also selects only clock edge times with one polarity to represent a system clock, i.e. selects edge times representing a clock set (up polarity) and disregards of the clock reset (down polarity). The clock edge times thereby routed to a tester bus 72 can be used on a plurality of channels.

The words output from the de-multiplexer 66 that represent data signals of a DUT are not selected as clock signals and are stored directly in random access memory 68. In the illustrative apparatus, the data is stored in 96×40 random access memory. Persons having ordinary skill in the art should appreciate that numerous other random access memory configuration can be used within the scope of the present disclosure.

The clock edge times on the tester bus 72 are used as pointers to address the data stored in random access memory 68. Routing circuitry 74 selects which clock on the bus to use as a pointer and routes that clock edge time to comparison circuit 76. Comparison circuit 76 provides the clock edge time as an address to random access memory 68 and reads the data edge time stored at that address. The data read from random access memory is compared with the clock edge time to determine the difference therebetween.

Comparison circuitry 78 compares expected values 77 of the difference between a data edge and synchronous clock edge with the difference found by comparison circuit 76. The comparison circuitry 78 outputs pass or fail signals for each comparison according to whether the difference from expectations is within specified limits.

Accordingly, the various embodiments of the invention described herein may provide a means for representing a signal under test in terms of its precise edge times and polarity of transition at the corresponding edge times. The edge times and polarities thus represented are stored for comparison with a timing signal such as the synchronous clock of a device under test. The timing signal is also represented in terms of its precise edge times. This representation of the timing signal edge time can be provided to a clock bus for use throughout a test system, for example, to compare with a corresponding data signal edge time in random access memory. The result of such a comparison can be checked against an expected value to determine whether a device under test is in compliance with test specifications.

An illustrative method of performing a time-stamp operation can be achieved by adding a small number of steps to the method for testing and evaluating synchronously clocked data without directly comparing the synchronous clock signals to the data signals under test that was described hereinbefore with reference to FIG. 1. The illustrative method for performing a time-stamp operation is described generally with reference to FIG. 5.

In an optional time-stamp initiation step 9, it is determined whether to implement a time-stamp or to bypass the time-stamp and perform a multi-strobe method of signal analysis as described in FIG. 1. It should be understood that an alternative method according to the present invention can permanently invoke the time-stamp system without an option to bypass it.

If the time-stamp is invoked, a sampling step 11 is performed in which a clock, hereinafter referred to as a time-stamp clock, initiates an input strobe. By way of non-limiting example, the time-stamp clock could be a system master oscillator clock divided by 8 (MOSC/8 clock). If the time-stamp is not invoked, a sampling step 10 is performed in which an edge generator initiates an input strobe. In either case, data signals and clock signals of a device under test (DUT) are sampled to acquire binary values of their state at a high rate using a strobe. The sampled data is thus acquired as a single-shot series of samples of the sampled signal. An encoding step 12, a selector step 14, a storage step 16 and a clock selection step 18 are performed as described hereinbefore with reference to FIG. 1.

If the time-stamp is selected at step 9, or permanently configured, a time-stamp calculation step 19 is performed in which the edge time is added to a clock cycle counter to obtain a time-stamp. The clock cycle counter determines the cycle count of the clock which initiated the input strobe at sampling step 11.

Figure 4:
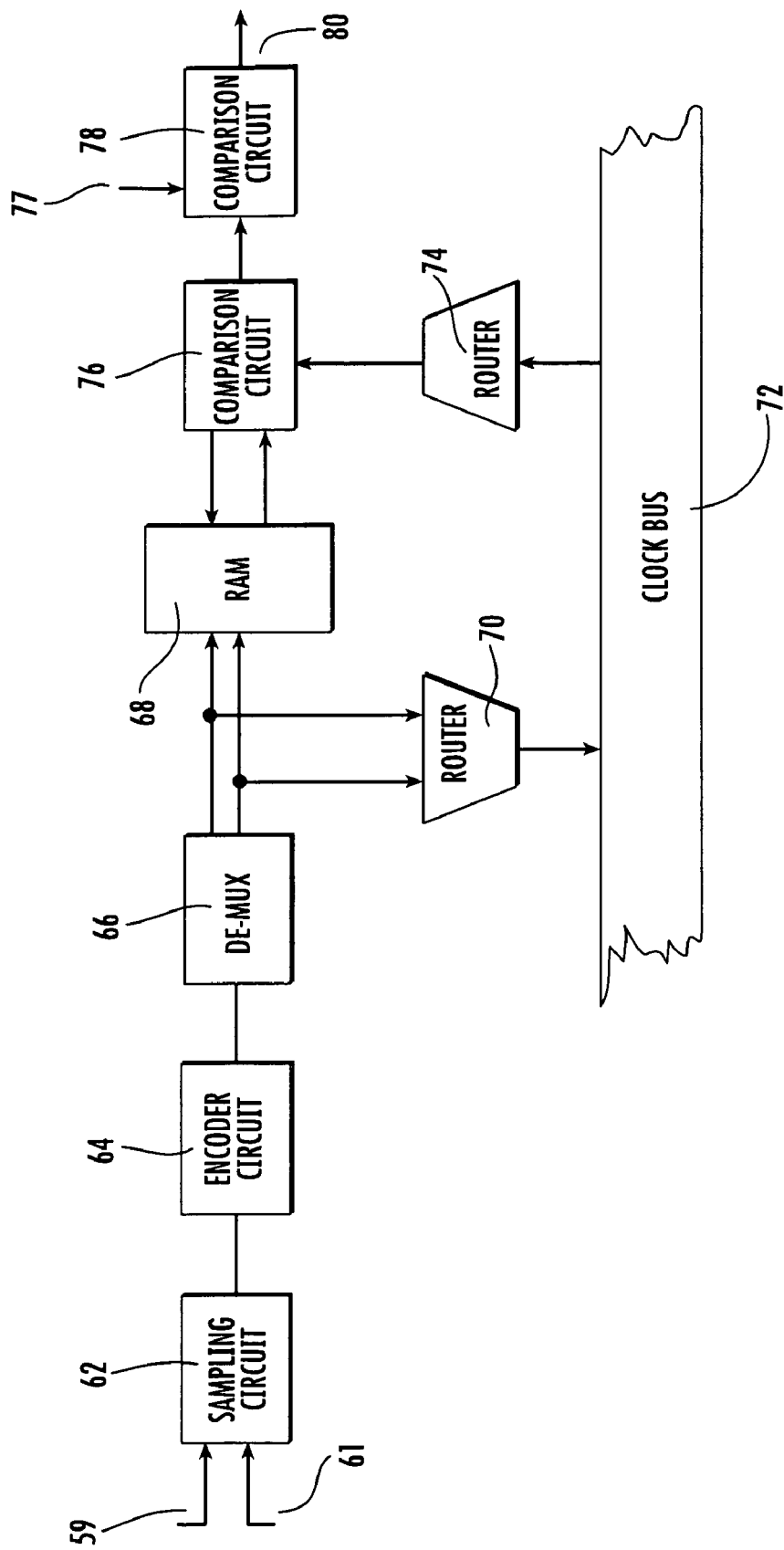
FIG. 4 is a schematic diagram of an apparatus for testing data signals or clock signals of a device under test using particular elements of illustrative embodiments of the present invention.
Figure 6:
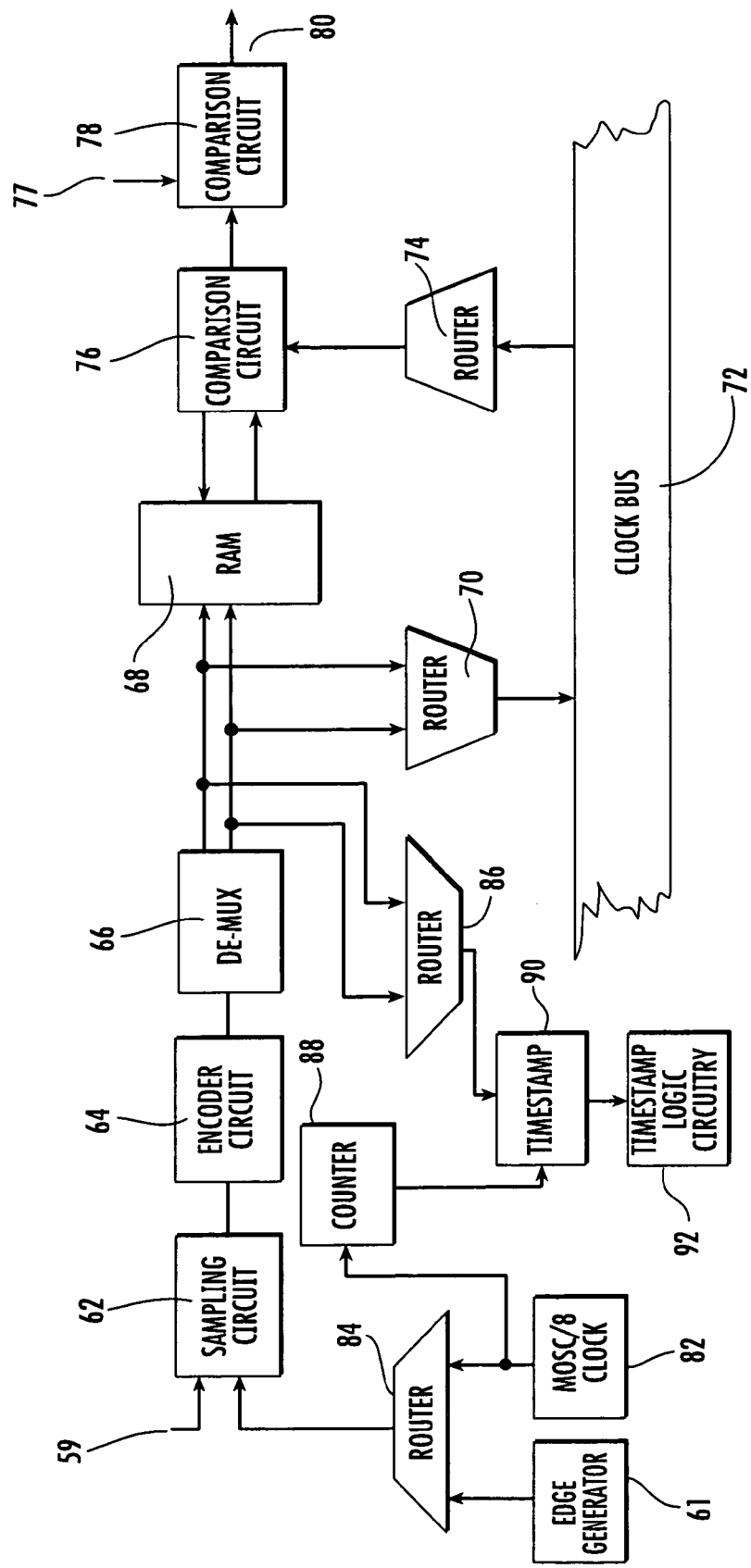
FIG. 6 is a schematic diagram of an apparatus for providing a time-stamp to an edge/event in a data or clock signal according to an illustrative embodiment of the present invention.

An illustrative apparatus for generating a time-stamp is described by adding elements to the apparatus of FIG. 4 for using a strobed representation of the synchronous clock to test data signals in a DUT. The illustrative apparatus for generating a time-stamp is described generally with reference to FIG. 6.

A digital signal 59 from a DUT is applied to a sampling circuit 62. A router 84 is used to select a second input to the sampling circuit 62. If a time-stamp is to be implemented, the router 84 causes a clock signal, such as a signal generated by an MOSC/8 clock 82, to be directed as the second input to the sampling circuit 62. If a time-stamp implementation is not selected, the router 84 causes a signal from an edge generator 61 to be applied as the second input to sampling circuit 62. In the illustrative apparatus, the sampling circuit 62 is the sampling apparatus described in detail with respect to FIG. 3. An encoder circuit 64, a de-multiplexer 66, router circuitry 70, a tester clock bus 72, random access memory 68, router circuitry 74, comparison circuitry 76, and comparison circuitry 78 which operates on expected values 77 to output a pass/fail signal 80 are configured and operate as described hereinbefore with reference to FIG. 3.

Figure 5:
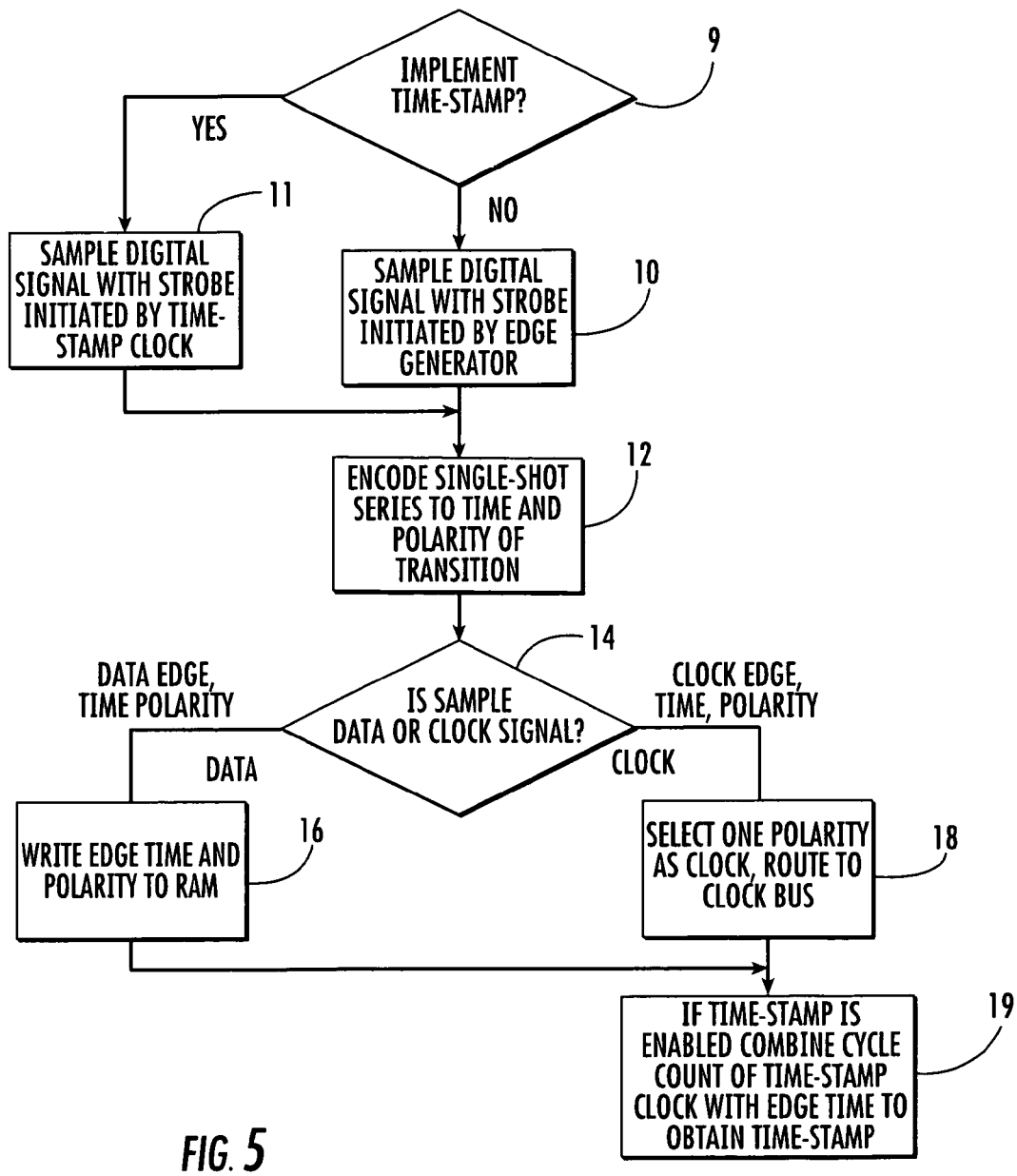
FIG. 5 is a functional block diagram of a method for providing a time-stamp to an edge/event in a data or clock signal according to an illustrative embodiment of the present invention.

If a time-stamp implementation is selected at step 9 of FIG. 5, router circuitry 86 directs words representing a clock edge time or data edge time from the de-multiplexer 66 to time-stamp circuitry 90. A counter 88 in communication with the sampler initiation clock 82 counts the cycles of the time-stamped clock. The counter 88 provides information to the time-stamp circuitry 90 which can be combined with the words representing edge times to form a time-stamp. In an illustrative embodiment, the time-stamp circuitry 90 adds the counter output to the encoded edge time to form the time-stamp. The time-stamp can be communicated to time-stamp logic circuitry 92 to be output or stored, for example.

Accordingly, the various embodiments of the present invention provide a means for generating a precise time-stamp of a signal under test by adding a small number of elements to the multi-strobe apparatus described hereinbefore. The time-stamp can be used to complement multi-strobe test methods or can stand alone and perform only time-stamp operations.

Although illustrative embodiments of the present invention is described herein generally in terms of multi-strobe test apparatus which can be switched into time-stamp mode by use of routers, persons skilled in the art should appreciate that the present invention can also be configured as a dedicated time-stamp. In a dedicated time-stamp embodiment, for example, input to the sampling circuit (62 in FIG. 6) would always be provided by clock 82. In this embodiment, edge generator 61 and router circuitry 84 could be omitted. Router circuitry 86 can also be omitted in dedicated time-stamp embodiments because the connection between the de-multiplexer 66 and time-stamp circuitry 90 can, in these embodiments, be hardwired.

Although illustrative embodiments of the present invention is described herein generally in terms of strobe pulses, persons having ordinary skill in the art should understand that strobe pulses can include application of a threshold voltage in a cycle of various wave forms such as square wave signals, sine waves signals, triangular waves, impulses and the like to trigger a corresponding latch. For example, it is envisioned that a leading edge of a rectangular wave pulse can be used as a strobe pulse in illustrative embodiments of the invention.

Although illustrative embodiments of the present invention is described herein generally in terms of automatic test equipment, persons having ordinary skill in the art should understand that the present invention can be useful in many other signal comparison operations. For example, it is envisioned that the present invention will find utility as a signal time-stamp in an unlimited number of high speed processing applications.

It will be understood that various modifications may be made to the embodiments disclosed herein. Therefore, the above description should not be construed as limiting, but merely as exemplification of the various embodiments. Those skilled in the art will envision other modifications within the scope and spirit of the claims appended hereto.

What is claimed is:

1. A method for generating a time-stamp for a data signal or clock signal of a device under test, comprising:
    initiating a strobe with a time-stamp clock signal, wherein the strobe has a frequency greater than or equal to a frequency of at least one data signal or clock signal of the device under test;
    applying a time-stamp clock to delay circuitry wherein the delay circuitry comprises a series of delay elements; and
    providing a connection between each of the delay elements to receive a plurality of sequentially delayed copies of pulses in the time-stamp clock signal to generate the strobe;
    applying each pulse of the strobe to a corresponding latch of a plurality of latches, each corresponding pulse having a input signal;
    applying the data signal or clock signal of the device under test to the input signal of each of the latches;
    receiving the state of the data signal or clock signal of the device under test based on an output of each of the latches; and
    combining a time-stamp clock count with the time of at least one of the strobe pulses by adding the digital word representing the time of the at least one strobe pulses to the clock count.

2. An apparatus for generating a time stamp for a digital signal, comprising:
    a time-stamp clock providing input to sampling circuitry, the sampling circuitry comprising a plurality of increasing strobe delay elements in communication with the time-stamp clock wherein each of the delay elements triggers a corresponding latch which samples a data signal or a clock signal of a device under test;
    an encoder in communication with the sampling circuitry which transforms the sampled digital signals to edge time data in a binary word; and
    a counter in communication with the time-stamp clock wherein the counter outputs a count of the time-stamp clock to time-stamp circuitry, wherein the time-stamp circuitry combines the count with the binary word to generate a time-stamp of an edge in the digital signal.

3. The apparatus according to claim 2, further comprising time-stamp logic circuitry in communication with the time-stamp circuitry, wherein the time-stamp logic circuitry is adapted for outputting the time-stamp of the edge.

4. The apparatus according to claim 2, further comprising:
    memory in communication with the encoder, the memory storing the binary word if digital signal is a data signal;
    routing circuitry in communication with the encoder, the routing circuitry selecting the binary word having a set polarity and routing the binary word to a clock bus for use on a plurality of channels if the digital signals are clock signals;
    memory address lines in communication with the clock bus wherein the memory address lines are configured to select clock time data on the bus and use the clock time data to address data stored in the memory;
    first compare circuitry in communication with the memory for comparing the clock time data to the data stored in the memory; and
    second compare circuitry in communication with the first compare circuitry, wherein the second compare circuitry compares expected values of the data corresponding to specific clock times with values represented by the binary words in the memory.

5. The apparatus according to claim 2, further comprising:
input routing circuitry in communication with the sampling circuitry; and
an edge generator in communication with the input routing circuitry wherein the routing circuitry selects between the input generator and the time-stamp clock for input to the sampling circuitry.

6. The apparatus according to claim 2, wherein the digital signal comprises a data signal.

7. The apparatus according to claim 2, wherein the digital signal comprises a clock signal.

* * * * *